United States Patent
Horii et al.

(10) Patent No.: US 11,157,667 B2
(45) Date of Patent: Oct. 26, 2021

(54) GATE FUSION FOR MEASURE IN QUANTUM COMPUTING SIMULATION

(71) Applicant: International Business Machines Corporation, Armonk, NY (US)

(72) Inventors: Hiroshi Horii, Tokyo (JP); Hitomi Chiba, Bunkyo-ku (JP); Jun Doi, Yokohama (JP)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 332 days.

(21) Appl. No.: 16/211,418

(22) Filed: Dec. 6, 2018

(65) Prior Publication Data

US 2020/0184025 A1    Jun. 11, 2020

(51) Int. Cl.
*G06F 30/20* (2020.01)
*G06N 10/00* (2019.01)

(52) U.S. Cl.
CPC ............. *G06F 30/20* (2020.01); *G06N 10/00* (2019.01)

(58) Field of Classification Search
CPC .......... G06F 30/20; G06F 9/455; G06N 10/00
See application file for complete search history.

(56) References Cited

U.S. PATENT DOCUMENTS

| | | |
|---|---|---|
| 2018/0046933 A1 | 2/2018 | La Cour et al. |
| 2018/0053809 A1 | 2/2018 | Freedman et al. |

OTHER PUBLICATIONS

Haner et al., "0.5 Petabyte Simulation of a 45-Qubit Quantum Circuit," 2017, Proceedings of the International Conference for High Performance Computing, Networking, Storage and Analysis, ACM, 10 pages.
Jones et al., "QuEST and High Performance Simulation of Quantum Computers," 2018, arXiv:1802.08032v5 [quant-ph], 9 pages.
Smelyanskiy et al., "qHiPSTER: The Quantum High Performance Software Testing Environment," 2016, arXiv:1601.07195v2 [quant-ph], 9 pages.
Ni et al., "Commuting quantum circuits: efficient classical simulations versus hardness results," Sep. 2018, 19 pages.
International Search Report and Written Opinion received for PCT Application Serial No. PCT/EP2019/082467 dated Mar. 2, 2020, 13 pages.

*Primary Examiner* — Matthew L Reames
(74) *Attorney, Agent, or Firm* — Amin, Turocy & Watson, LLP

(57) ABSTRACT

Techniques for simulating a quantum circuit based on fusion of at least a portion of a measure gate is provided. Data representing a quantum circuit comprising a quantum gate and a measure gate is received. The measure gate in the quantum circuit is divided into one or more virtual gates and at least one of the one or more virtual gates is fused with the quantum gate. The gate fusion combines the operations of the fused gates and cache blocking to more efficiently simulate the quantum circuit. In one embodiment, the simulation of the quantum circuit is executed locally on a computing device. Alternatively, the simulation of the quantum circuit is performed remotely over a network via an application program interface ("API") and results of the simulation are reported via the API.

15 Claims, 6 Drawing Sheets

GATE FUSION FOR MEASURE IN QUANTUM COMPUTING SIMULATION

BACKGROUND

Simulation of quantum circuits and quantum computation is an important part of researching quantum computing algorithms, architectures, and devices. However, simulating quantum circuits of any significant breadth (i.e., qubit count) requires substantial memory and central processing unit (CPU) resources. The memory requirements and the time required to simulate an elementary circuit operation, grow exponentially with the number of qubits. For example, the simulation of a 26-qubit quantum circuit, using double-precision arithmetic, requires 1 gigabyte (GB) of memory. Indeed, the memory requirements follow an exponential curve, doubling with each additional qubit. Significant CPU resources are also required to perform the required computations and to manipulate the large data structures involved in simulating a quantum circuit. Accordingly, simulation of quantum circuits and computations can be challenging to simulate due to the size of the quantum computing systems, even with the use of powerful computers or computing systems.

Smelyanskiy1 et al. discusses "implementation of a quantum simulator on a classical computer, that can simulate general single qubit gates and two-qubit controlled gates." See Smelyanskiy1 et al., "qHiPSTER: The Quantum High Performance Software Testing Environment," 2016, arXiv: 1601.07195v2 [quant-ph], Abstract. Further, Smelyanskiy1 et al. discusses performance of "a number of single- and multi-node optimizations, including vectorization, multi-threading, cache blocking, as well as overlapping computation with communication." See id.

However, these simulations remain inefficient regarding memory utilization (e.g., cache hits and misses) and execution time (e.g., the time needed to perform the simulated computation).

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, computer-implemented methods, apparatuses, and/or computer program products that facilitate simulation based on gate fusion with a measure gate.

According to an embodiment, a system can comprise a memory that stores computer executable components and a processor that executes the computer executable components stored in the memory. The computer executable components can comprise a development component that receives data for a quantum circuit. The quantum circuit comprises a quantum gate that manipulates a state of a qubit in the quantum circuit and a measure gate that measures the state of the qubit in the quantum circuit. The development component generates a representation of the quantum circuit based on dividing the measure gate into one or more virtual gates and fusing at least one of the one or more virtual gates with the quantum gate. An interface component submits a simulation based on the representation of the quantum circuit and receives a simulation result based on the simulation request. An advantage of dividing the measure gate into virtual gates and fusing one or more of the virtual gates with a quantum gate in the quantum circuit is that it improves the temporal and spatial locality of the simulation data in the memory to mitigate and/or reduce fragmented access of the memory in the system.

According to a further embodiment, the interface component can comprise a simulator component that simulates the quantum circuit. An advantage of this is to enable simulation of the quantum circuit locally.

According to another further embodiment, the interface component can comprise a network interface to connect to a network and submit the simulation request to a location on the network. An advantage of this is that it enables the system to utilize a remote computing resource to perform the simulation on its behalf, for example, for a simulation for large qubit quantum circuit. In addition, this enables the system to cooperate with multiple simulators and/or hardware resources over a network.

According to a further embodiment, the development component divides a measure gate into a first virtual gate for a sum operation, a second virtual gate for a determine operation, and third virtual gate for a normalization operation. The first virtual gate can be fused with a quantum gate that is adjacent and previous the measure gate while the third virtual gate can be fused with a quantum gate that is adjacent, after the measure gate. An advantage of this embodiment is that the virtual gates for the measure gate can be fused with different quantum gates, for example, the quantum gates that are adjacent before and after the measure gate in the quantum circuit.

According to an embodiment, a system can comprise a memory that stores computer executable components and a processor that executes the computer executable components stored in the memory. The computer executable components can comprise an interface component that receives, from the network, a simulation request comprising a representation of a quantum circuit. The quantum circuit comprises a quantum gate and a measure gate that has been divided into one or more virtual gates and at least one of the one or more virtual gates has been fused with the quantum gate. A simulation component simulates the quantum circuit based on the simulation request and transmits a result, for example, to a user computer, workstation, and the like. An advantage of dividing the measure gate into virtual gates and fusing one or more of the virtual gates with a quantum gate in the quantum circuit is that it improves the temporal and spatial locality of the simulation data in the memory to mitigate and/or reduce fragmented access of the memory in the system.

According to a further embodiment, the representation of the quantum circuit is based on the measure gate being divided into a first virtual gate for a sum operation, a second virtual gate for a determine operation, and third virtual gate for a normalization operation. The first virtual gate can be fused with a quantum gate that is adjacent and previous the measure gate while the third virtual gate can be fused with a quantum gate that is adjacent, after the measure gate. An advantage of this embodiment is that the virtual gates for the measure gate can be fused with different quantum gates, for example, the quantum gates that are adjacent before and after the measure gate in the quantum circuit.

According to an embodiment, a computer-implemented method can comprise receiving quantum circuit data that represents a quantum circuit. The quantum circuit comprises a quantum gate and a measure gate. The measure gate is divided into one or more virtual gates. The quantum circuit is simulated based on a fusion of at least one of the one or more virtual gates with the quantum gate to generate a simulation result. An advantage of dividing the measure gate into virtual gates and fusing one or more of the virtual gates with a quantum gate in the quantum circuit is that it improves the temporal and spatial locality of the simulation data in the memory to mitigate and/or reduce fragmented access of the memory in the system.

According to a further embodiment, the method can further comprise dividing a measure gate into a first virtual gate for a sum operation, a second virtual gate for a determine operation, and third virtual gate for a normalization operation. In yet further implementations, the method can further comprise fusing the first virtual gate with a quantum gate that is adjacent and previous the measure gate and fusing the third virtual gate with a quantum gate that is adjacent, after the measure gate. An advantage of these implementations of the method is that it allows the virtual gates for the measure gate to be fused with different quantum gates, for example, the quantum gates that are adjacent before and after the measure gate in the quantum circuit.

According to a further embodiment, a method can comprise receiving quantum circuit data for a quantum circuit that comprises a quantum gate and a measure gate. A representation of the quantum circuit is generated based on dividing the measure gate into one or more virtual gates and fusing at least one of the one or more virtual gates with the quantum gate. A simulation request based on the representation of the quantum circuit is then transmitted, for example, to a backend computing system, server, and the like. An advantage of this is that it enables the method to be performed with a remote computing resource, for example, for a simulation for large qubit quantum circuit. In addition, this embodiment enables method to be used on multiple simulators and/or hardware resources over a network, for example, to perform multiple simulations or large simulations.

According to a further embodiment, the method comprises generating a representation of the quantum circuit to further comprise dividing a measure gate into a first virtual gate for a sum operation, a second virtual gate for a determine operation, and third virtual gate for a normalization operation. In yet further implementations, the method can further comprise fusing the first virtual gate with a quantum gate that is adjacent and previous the measure gate and fusing the third virtual gate with a quantum gate that is adjacent, after the measure gate. An advantage of these implementations of the method is that it allows the virtual gates for the measure gate to be fused with different quantum gates, for example, the quantum gates that are adjacent before and after the measure gate in the quantum circuit.

According to another embodiment, a computer program product facilitates quantum computing simulation of quantum circuit is provided. The quantum circuit comprises a quantum gate and a measure gate. The computer program product comprises a computer readable storage medium having program instructions embodied on it. The program instructions are executable by a processor to cause the processor to receive quantum circuit data that represents the quantum circuit, divide the measure gate into one or more virtual gates, and request a simulation of the quantum circuit based on a fusion of at least one of the one or more virtual gates with the quantum gate. An advantage of this approach in the computer program product is that it improves the temporal and spatial locality of program instructions when executed by the processor in the memory and mitigates and/or reduces fragmented access of the memory in the system performing the simulation.

According to a further embodiment, the computer program product can comprise program instructions executable by a processor to cause the processor to divide a measure gate into a first virtual gate for a sum operation, a second virtual gate for a determine operation, and third virtual gate for a normalization operation and to fuse the first virtual gate with a quantum gate that is adjacent and previous the measure gate and fusing the third virtual gate with a quantum gate that is adjacent, after the measure gate. An advantage of these implementations is that it allows the virtual gates for the measure gate to be fused with different quantum gates, for example, the quantum gates that are adjacent before and after the measure gate in the quantum circuit.

According to a further embodiment, the computer program product further comprises program instructions to cause a processor to connect to a network and request simulation of the quantum circuit based on transmitting a simulation request to a location on the network. An advantage of this is that it enables the processor, when executing the program instructions, to utilize a remote computing resource, for example, for a simulation for large qubit quantum circuit. In addition, this embodiment enables the processor to utilize multiple simulators and/or hardware resources over a network, for example, to perform multiple simulations or large simulations.

DETAILED DESCRIPTION

Figure 1:
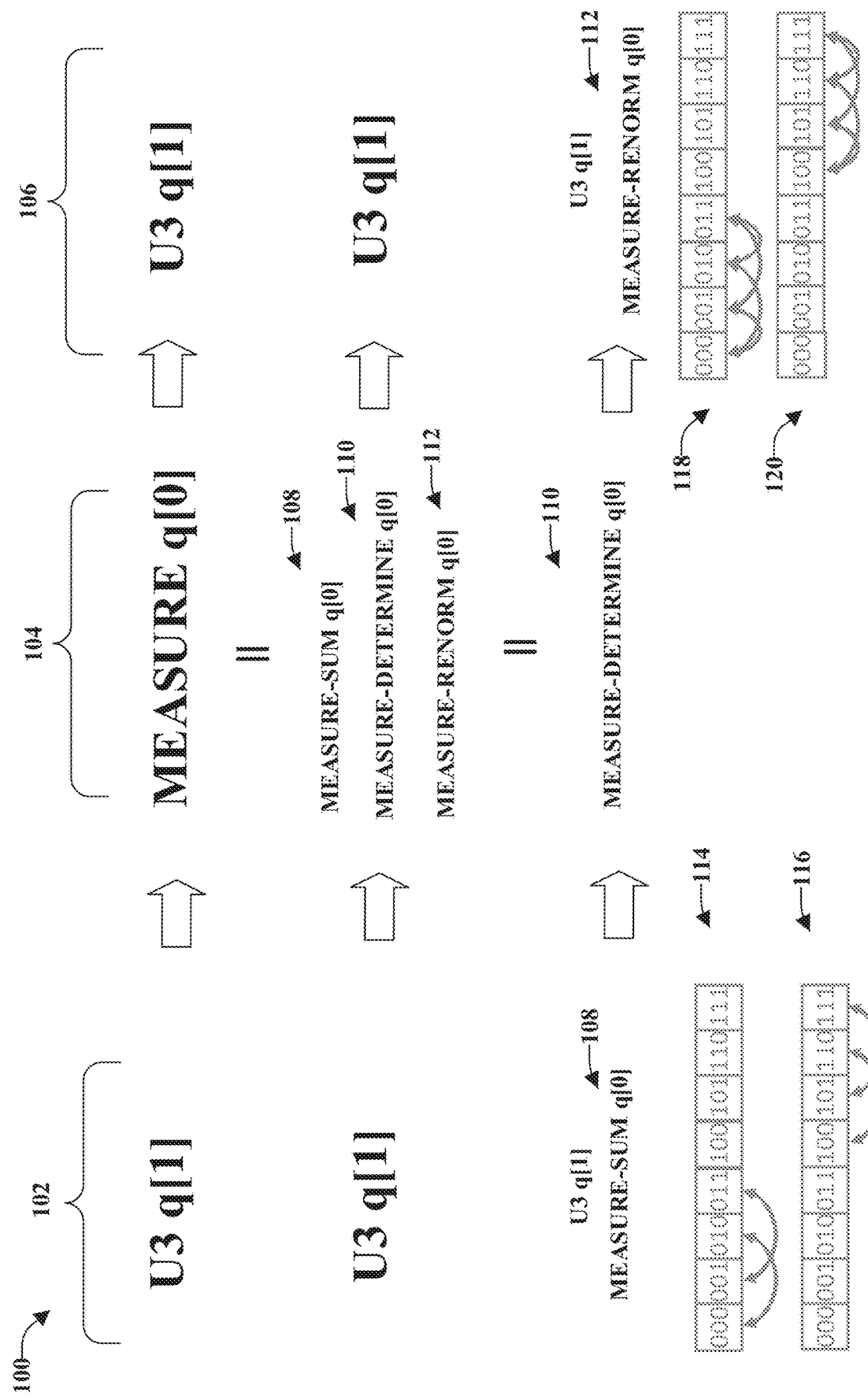
FIG. 1 illustrates a non-limiting, example embodiment of schematic representation that improves the store and load operation in a memory to simulate a quantum circuit in accordance with one or more embodiments herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

To facilitate the use and research of quantum systems, one or more embodiments for simulating quantum circuits are described herein. In one embodiment, software can be installed on a computing device that allows a user to run quantum circuit-based experimental programs on a quantum circuit simulator running locally or one or more simulators that can be accessed remotely over a network. One or more embodiments allow the user to create and input quantum circuits in textual form, such as via text editor, in graphical form, etc. A quantum circuit representation, such as an Open Quantum Assembly Language (QASM or OpenQASM) file, is then generated by the software. As will be described further herein, the quantum circuit representation is optimized to minimize the computing resources needed to simulate the quantum circuit. Simulations of the quantum circuit are requested (locally or from a remote system) and results are output to the user. The results can be in any graphical textual form that facilitates analysis by a user or another computing device.

A problem of the art is that fusion of a measure gate with another quantum gate for simulating a quantum circuit was neither taught nor suggested because of the complexity of the operations performed to simulate a measure gate. In one or more embodiments, dividing the measure gate into virtual gates provides a solution. Although gate fusion for quantum simulation are known, the embodiments are the first to recognize gate fusion with at least a portion of a measure gate based on dividing the measure gate into virtual gates.

An advantage of the embodiments is to mitigate the relatively high computational demands placed upon a system running such a simulation. For example, fusion of the measure gate with one or more other quantum gates enables load and store operations executed for the simulation to be conducted more efficiently, for example, based on cache blocking for the computations used by the simulation. Accordingly, some of the embodiments provide improved temporal locality, permit more efficient memory usage, and reduce execution time of the simulation.

Furthermore, in some embodiments, the measure gate can be divided into virtual gates for a sum operation, a determine operation, and a renorm (or renormalization) operation. The virtual gate for the sum operation can then be fused to a previous quantum gate adjacent to the measure gate. The virtual gate for the renorm operation can be fused with the quantum gate that is adjacent after the measure gate. In embodiments where the measure gate is divided into a first virtual gate for a sum operation, a second virtual gate for a determine operation, and third virtual gate for a normalization operation, these embodiments are useful to enable virtual gates for the measure gate to be fused with different quantum gates, for example, the quantum gates that are adjacent before and after the measure gate in the quantum circuit.

The embodiments where a simulation request is submitted to a location on the network is also useful for enabling the system and methods to utilize a remote computing resource to perform the simulation, for example, for a simulation for large qubit quantum circuit. In addition, these embodiments are useful to allow cooperation with multiple simulators and/or hardware resources over a network.

FIG. 1 illustrates a non-limiting, example embodiment of schematic representation that improves the store and load operation in a memory to simulate a quantum circuit in accordance with one or more embodiments herein. As shown, a quantum circuit 100 can comprise a first quantum gate, a U3 gate 102 operating on a qubit q1, a measure gate 104 operating on a qubit q0, and an additional quantum gate, such as a second U3 gate 106 operating on qubit q1.

However, in accordance with an embodiment, the measure gate 104 can be divided into virtual gates 108, 110, and 112. A first virtual gate 108 can correspond to sum operations based on calculating the probability of a qubit being in state 0 or 1 based on iterating across all states. A second virtual gate 110 can correspond to a determine operation to determine whether a qubit is in state 0 or 1 based on a random number. A third virtual gate 112 can correspond to a normalization or renorm operation that normalizes the state of the qubit.

One or more of the virtual gates 108, 110, and 112 can then be fused with a quantum gate, such as quantum gates 102 and 106. For example, as shown, to facilitate a simulation of the quantum circuit 100, virtual gate 108 can be fused (and/or combined) with U3 gate 102 and virtual gate 112 can be fused (and/or combined) with U3 gate 106. As shown, this fusion allows the store and load operations to be executed based on block caching. For example, as shown in operations 114 and 116, halves of U3 gate 102 and virtual gate 108 are combined and executed within the same memory access. Likewise, as shown in operations 118 and 120, halves of U3 gate 106 and virtual gate 112 are combined and executed within the same memory access. This approach thus allows the simulation to be performed in fewer operations.

In addition, in some embodiments, the operations for virtual gates 108 and 112 can scheduled and executed based on the commutativity (i.e., the extent by which changing of the order of operations when fusing the virtual gates 108 and 112 with a quantum gate does not change a result of the overall operation) of the operations for the quantum gate being fused. For example, the sum operations implemented by virtual gate 108 can be executed and aggregated earlier and virtual gate 112 can be executed and aggregated later based on the extent of commutativity of the operations being implemented by virtual gates 108 and 112 and a respective quantum gate to which they are being fused. As another example, fusing 2 quantum gates followed by single qubit measurements can be efficiently simulated. In addition, for example, quantum circuits composed of exponentiated Pauli operators can be simulated efficiently when followed by single-qubit measurements.

Figure 2:
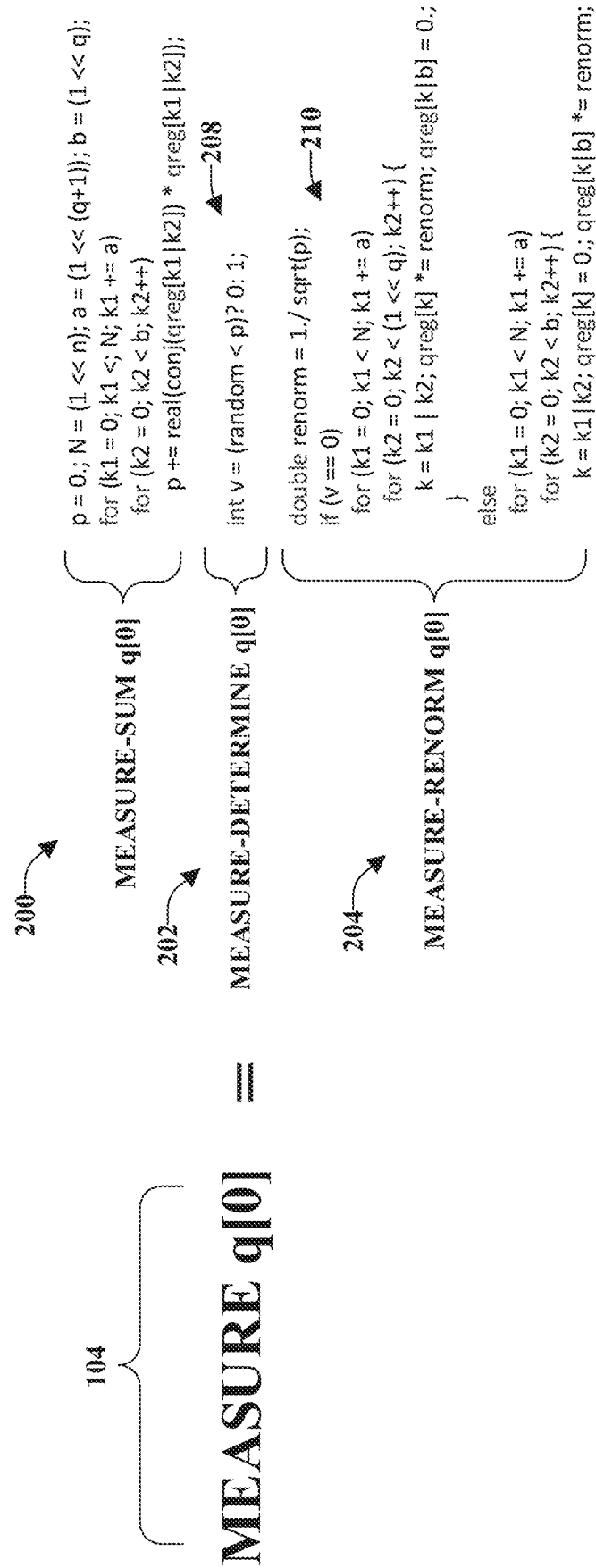
FIG. 2 illustrates a non-limiting example embodiment of dividing a measure gate into virtual gates in accordance with one or more embodiments herein.

FIG. 2 illustrates a non-limiting example embodiment of dividing a measure gate into virtual gates in accordance with one or more embodiments herein. As shown, the measure gate 104 is divided into virtual gates 200, 202, and 204 for sum, determine, and renorm operations respectively. As further shown, virtual gates 200, 202, and 204 can be implemented or compiled into program code to perform the simulation.

For example, pseudo code portion 206 can perform the sum operations in measure gate 104 for virtual gate 200. Pseudo code 208 can perform the determine operation in measure gate 104 for virtual gate 202. And, pseudo code 210 can perform the renorm operations in measure gate 204 for virtual gate 212.

Accordingly, when a simulation is performed, these code portions 206, 208 and 210 can be fused with the store and load operations for other quantum gate, such as quantum gates 102 and 106 (not shown in FIG. 2) and optimized to mitigate the memory access requests and improve their locality in memory.

Figure 3:
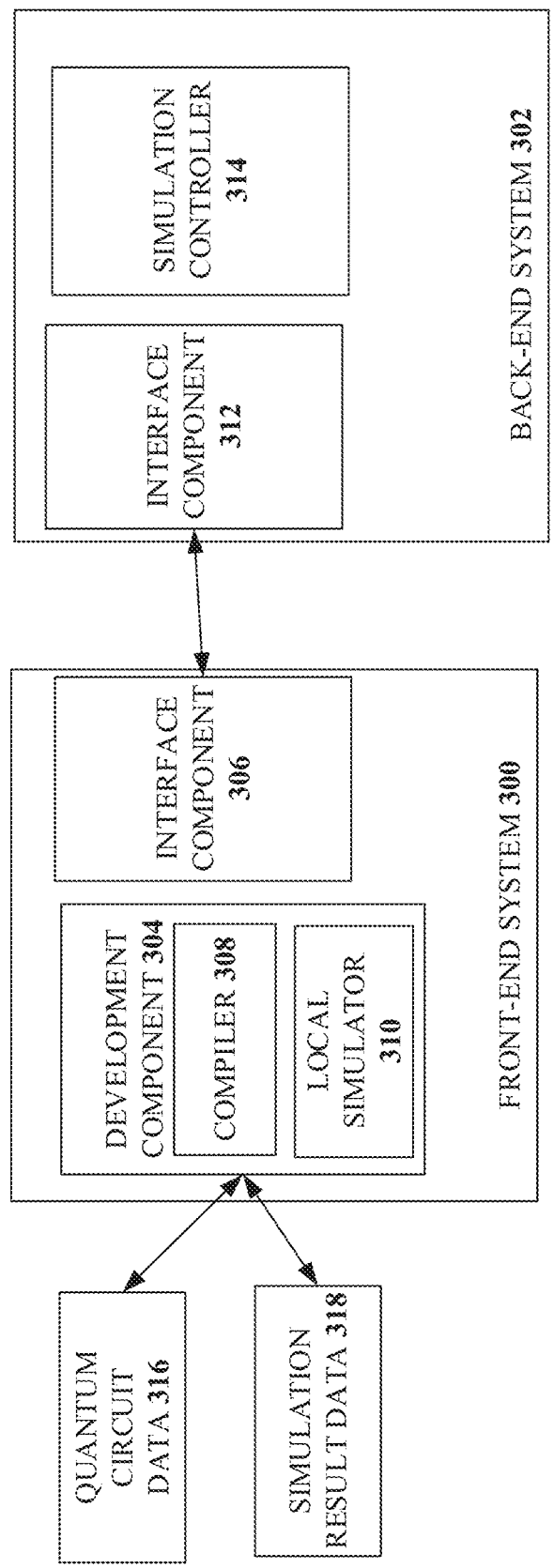
FIG. 3 illustrates a non-limiting, example embodiment of a block diagram of a system that facilitates quantum computing simulation in accordance with one or more embodiments described herein.

FIG. 3 illustrates a non-limiting, example embodiment of a block diagram of a system that facilitates quantum computing simulation in accordance with one or more embodiments described herein. As shown, the embodiments can be implemented based on a front-end system 300 and a back-end system 302. Systems 300 and 302 will now be further described.

Repetitive description of like elements employed in other embodiments described herein is omitted for sake of brevity. For example, the systems 300 and 302 can comprise a processor, a memory, network interface, and/or a storage. The memory can store computer executable components and instructions.

Aspects of systems (e.g., systems 300, 302, and the like), apparatuses, or processes explained in this disclosure can constitute machine-executable component(s) embodied within machine(s), e.g., embodied in one or more computer readable mediums (or media) associated with one or more machines. Such component(s), when executed by the one or more machines, e.g., computer(s), computing device(s), virtual machine(s), etc. can cause the machine(s) to perform the operations described. For example, FIG. 6 describes a non-limiting, example computing environment 600 that can be implemented in systems 300 and 302.

In various embodiments, the systems 300 and 302 can be any type of component, machine, device, facility, apparatus, and/or instrument that comprises a processor and/or can be capable of effective and/or operative communication with a wired and/or wireless network. Components, machines, apparatuses, devices, facilities, and/or instrumentalities that can comprise the front-end system 300 can include tablet computing devices, handheld devices, server class computing machines and/or databases, laptop computers, notebook computers, desktop computers, cell phones, smart phones, consumer appliances and/or instrumentation, industrial and/or commercial devices, hand-held devices, digital assistants, multimedia Internet enabled phones, multimedia players, and the like.

Components, machines, apparatuses, devices, facilities, and/or instrumentalities that can comprise the back-end system 302 can include, server class computing machines and/or databases, laptop computers, notebook computers, desktop computers, and the like. The system 302 and/or components of the system 302 can be employed to solve new problems that arise through advancements in technologies mentioned above, computer architecture, and/or the like. One or more embodiments of the system 302 can provide technical improvements to quantum computing systems, quantum circuit systems, quantum processor systems, artificial intelligence systems, and/or other systems. One or more embodiments of the system 302 can also provide technical improvements to a quantum processor (e.g., a superconducting quantum processor) by improving processing performance of the quantum processor, improving processing efficiency of the quantum processor, improving processing characteristics of the quantum processor, improving timing characteristics of the quantum processor, and/or improving power efficiency of the quantum processor.

Accordingly, systems 300 and 302 can employ hardware and/or software to solve problems that are highly technical in nature, that are not abstract and that cannot be performed as a set of mental acts by a human. Further, in certain embodiments, some of the processes performed can be performed by one or more specialized computers (e.g., one or more specialized processing units, a specialized computer with a quantum computing component, etc.) to carry out defined tasks related to machine learning.

In the embodiment shown, the front-end system 300 can comprise a development component 304 and an interface component 306. These components will now be further described.

Development component 304 provides a development platform that allows a user to create/input quantum circuits, compile the quantum circuits into a representation that can be simulated, such as a QASM file, and simulate the quantum circuit. In some embodiments, the development component 304 is a software development kit that can be installed on front-end system 300. Development component 304 can comprise various application programming interfaces (APIs) and libraries that interface a programming language, such as Python or C++. In addition, the development component 304 can comprise various tools to assist in creating and editing quantum circuit data, such as quantum circuit data 316, and compile the quantum circuit data 316 into a quantum circuit representation, such as a QASM file. The development component 304 can also comprise various tools to analyze and format simulation result data 318 into graphical, textual, or other desired format.

As shown, the development component 304 can comprise a compiler 308. Compiler 308 can be a compiler or trans-compiler that transforms and converts quantum circuit data 316 into an appropriate representation, such as a QASM file. In some embodiments, compiler 308 can provide allow the quantum circuit data 316 to be simulated based on different hardware configurations, quantum scope and breadth, etc. In one embodiment, the compiler 308 can receive as input the quantum circuit data 316, unroll quantum circuit data 316 by expanding the data structures and definitions, perform various swaps to optimize the quantum circuit, and perform one or more gate cancellations.

In one embodiment, the compiler 308 can divide a measure gate, such as measure gate 204 into virtual gates 108, 110, and 112. As noted above, in one embodiment, virtual gate 108 can correspond to sum operations based on calculating the probability of a qubit being in state 0 or 1 based on iterating across all states. Virtual gate 202 can correspond to a determine operation to determine whether a qubit is in state 0 or 1 based on a random number. Virtual gate 204 can correspond to a normalization or renorm operation that normalizes the state of the qubit.

Compiler 308 can then fuse one or more of the virtual gates 108, 110, and 112 can then be fused with a quantum gate indicated in the quantum circuit data 316, for example, as described with reference to FIGS. 2 and 3.

Local simulator 310 can be simulator that is executed locally on front-end system 300. Local simulator 310 can provide a local simulation environment to develop and deploy simulation experiments on front-end system 300.

Interface component 306 provides an interface for front-end system 300 to communicate with other components running on system 300, such as compiler 308 and local simulator 310, as well as other computing devices, such as back-end system 302. In one embodiment, interface component 306 is software that provides various routines, protocols, and tools for front-end system 300.

In the embodiment shown, the back-end system 302 provides a remote additional resource to perform quantum computing simulations. For example, back-end system 302 can be accessible via a network and provide an array of simulators and quantum computing hardware. A plurality of front-end systems 300 can interface with back-end system 302, for example, to submit simulation requests. As shown, back-end system 302 can comprise an interface component 312 and a simulation controller 314.

Interface component 312 is a corresponding API to interface component 306 running on front-end system 300. In some embodiments, interface component 312 can assign unique tokens to each simulation request received from front-end system 300.

Simulation controller 314 schedules, executes, and outputs the results of the simulation requests, for example, received from front-end system 300. The simulation controller 314 provide simulation result data 318 via interface component 312. Simulation controller 314 can provide simulation result data 318 in various forms, such as graphical data, text/numerical data, stream data, etc.

Figure 4:
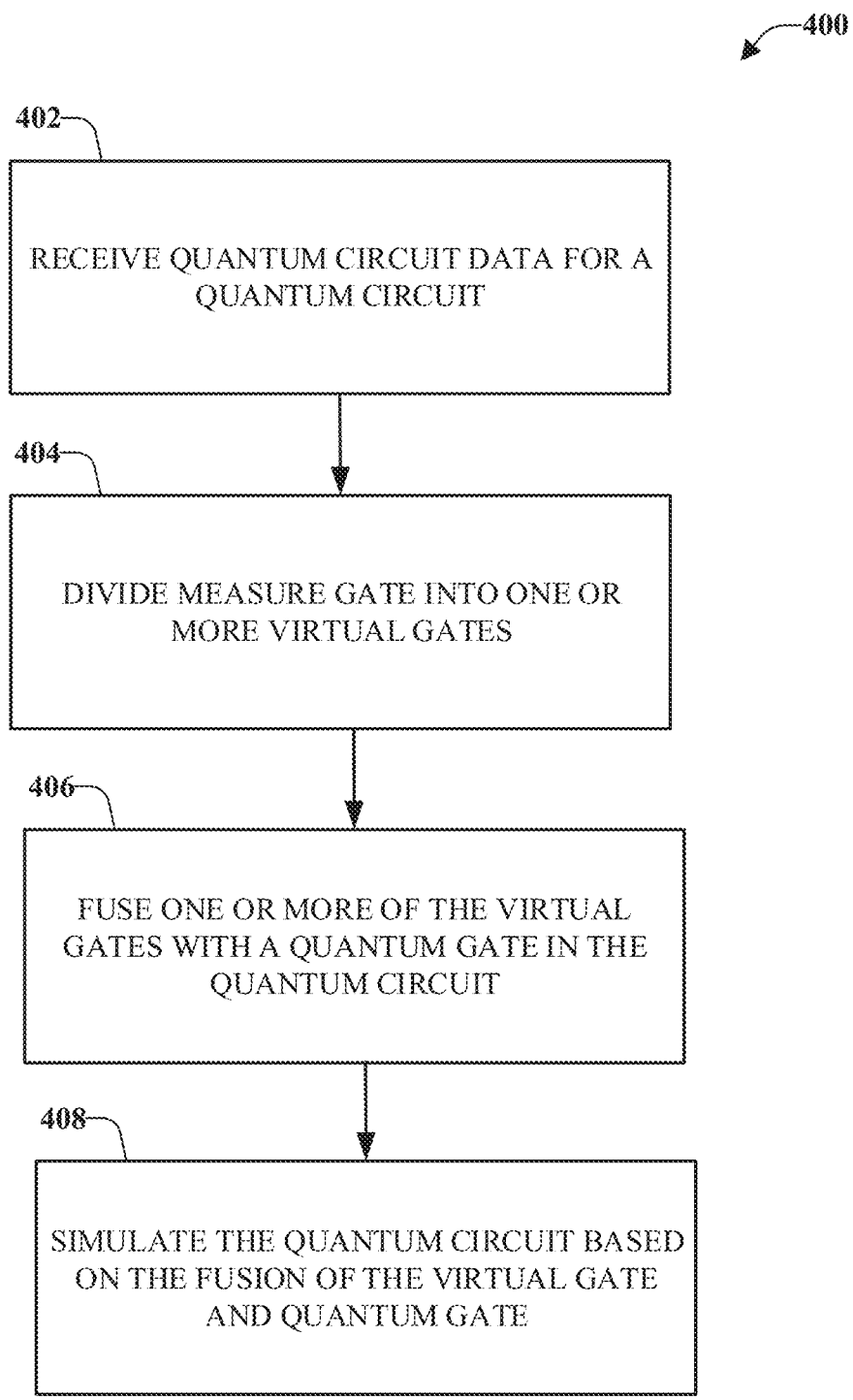
FIG. 4 illustrates a non-limiting, example flow diagram for simulating a quantum circuit in accordance with one or more embodiments described herein.

FIG. 4 illustrates a non-limiting, example flow diagram for simulating a quantum circuit in accordance with one or more embodiments described herein. Repetitive description of like elements employed in other embodiments described herein is omitted for sake of brevity. As will be further described, a method 500 can illustrate a process for simulating a quantum circuit locally on a computing device, such as front-end system 300 and fusing at least a portion of the measure gate with a quantum gate to improve the simulation.

At 402, quantum circuit data 316 is received by front-end system 300 (via development component 304) for a quantum circuit. For example, a user at front-end system 300 can use development component 304 to receive quantum circuit data 316 for a quantum circuit. The quantum circuit data 316 can be provided from a quantum algorithm, a text editor, such as QASM editor, or other form of data input. In response, development component 304 and compiler 308 can then generate a representation of the quantum circuit, such as in the form of a QASM file or other data format.

At 404, a measure gate (e.g., measure gate 204) is divided (e.g., via compiler 308 in development component 304) into one or more virtual gates. For example, compiler 308 in development component 304 can compile analyze and parse the quantum circuit data 316 and perform various transformation or edits to the quantum circuit. As noted above, in one embodiment, the compiler 308 can divide measure gates, such as measure gate 204, into one or more virtual gates, such as virtual gates 108, 110, and 112.

At 406, one or more of the virtual gates (such as virtual gates 108, 110, and 112) are fused (e.g., by compiler 308 in development component 304) with a quantum gate (such as measure gate 204) in the quantum circuit represented in quantum circuit data 316. For example, compiler 308 compile virtual gates 108, 110, and 112 into code portions 206, 208, and 210 and combine these code portions with operations with a quantum gate, such as a quantum gate adjacent to the measure gate 204. Development component 304 can then generate a new, revised representation of the quantum circuit and modify quantum circuit data 316, for example, as a revised QASM file.

At 408, the quantum circuit is simulated (e.g., by local simulator 310). For example, development component 304 can submit a simulation request to interface component 306 with an address locator corresponding to local simulator 310. Alternatively, development component 304 can use interface component 306 and submit a simulation request to back-end system 302. For example, the development component 304 may determine a location of a simulator, for example, based on a network location specified in the QASM file for one or more simulators hosted by back-end system 304.

Figure 5:
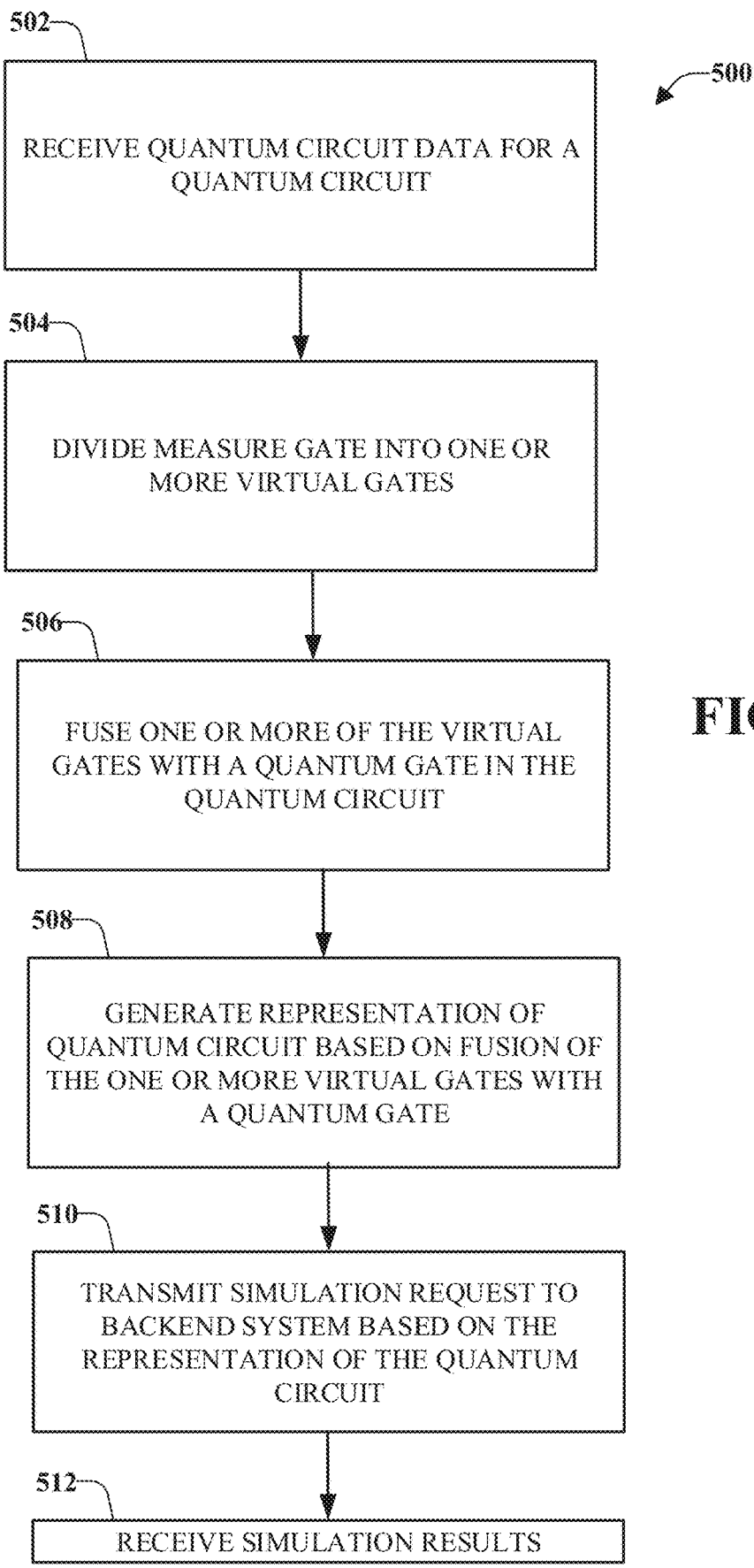
FIG. 5 illustrates a non-limiting, example flow diagram for simulating a quantum circuit in accordance with one or more embodiments described herein.

FIG. 5 illustrates a non-limiting, example flow diagram for simulating a quantum circuit in accordance with one or more embodiments described herein. Repetitive description of like elements employed in other embodiments described herein is omitted for sake of brevity. As will be further described, method 500 can illustrate a process for submitting a simulation request to remote device, such as back-end system 302. In this embodiment, the simulation request is based upon fusing at least a portion of a measure gate with a quantum gate to improve the simulation's memory and processing performance.

At 502, quantum circuit data 316 is received (e.g., by development component 304) for a quantum circuit. For example, a user at front-end system 300 can use development component 304 to receive quantum circuit data 316 for a quantum circuit. The quantum circuit data 316 can be provided from a quantum algorithm, a text editor, such as QASM editor, or other form of data input. In response, development component 304 and compiler 308 can then generate a representation of the quantum circuit, such as in the form of a QASM file or other data format.

At 504, a measure gate (such as measure gate 204) is divided (by compiler 308 in development component 304) into one or more virtual gates (such as virtual gates 108, 110, and 112). For example, compiler 308 in development component 304 can compile analyze and parse the quantum circuit data 316 and perform various transformation or edits to the quantum circuit. As noted above, in one embodiment, the compiler 308 can divide measure gates, such as measure gate 204, into one or more virtual gates, such as virtual gates 108, 110, and 112.

At 506, one or more of the virtual gates (such as virtual gates 108 and 112) are fused with a quantum gate (such as measure gate 204) in the quantum circuit. For example, compiler 308 compile virtual gates 108, 110, and 112 into code portions 206, 208, and 210 and combine these code portions with operations with a quantum gate, such as a quantum gate adjacent to the measure gate 204. For example, in one embodiment, the compiler 308 fuses virtual gates by creating a $2^n \times 2^n$ unitary matrix to represent each virtual gate being fused and multiplying all the unitary matrixes to calculate a new $2^n \times 2^n$ matrix to represent the gate fusion.

At 508, a representation of the quantum circuit is generated (by development component 304) based on the fusion of the virtual gate and a quantum gate in the quantum circuit. For example, development component 304 can generate a new, revised representation of the quantum circuit and modify quantum circuit data 316, for example, as a revised QASM file.

At 510, the development component 304 can then create a simulation request based on quantum circuit data 316 and transmit (e.g., via the interface component 306) the simulation request to back-end system 302. For example, development component 304 can submit a simulation request to interface component 306 having an address locator corresponding to the location of back-end system 302 on a network. In response, interface component 306 can forward the simulation request to interface component 312 at back-end system 302. Simulation controller 314 can then schedule and run the simulation. In some embodiments, simulation controller 314 can provide a plurality of simulation platforms corresponding to quantum computing devices having different breadth of qubits, e.g., of 5 qubits or more. Simulation controller 314 will then generate simulation result data 318, for example, based on compiling and executing program code (e.g., QASM data) in the simulation request. The simulation result data can be in any suitable form, such as text, numerical data, graphical data, stream data, etc.

At 512, simulation results are received. For example, front-end system 300 can receive simulation result data 318 from back-end system 302 via interface components 306 and 312. In one embodiment, a user can use one or more tools provided by development component 304 to output, analyze, and/or visualize the simulation result data 318.

In an example implementation, the program instructions can cause a processor, for example on front-end system 300 to receive quantum circuit data that represents a quantum circuit. The quantum circuit comprises a quantum gate and a measure gate. The program instructions can further cause the processor to divide the measure gate into one or more virtual gates and simulate the quantum circuit based on a fusion of at least one of the one or more virtual gates with the quantum gate to generate a simulation result According to another example implementation, the program instructions can cause a processor, for example on front-end system 300, to receive quantum circuit data for a quantum circuit, generate a representation of the quantum circuit based on dividing the measure gate into one or more virtual gates and fusing at least one of the one or more virtual gates with the quantum gate; and transmitting, over a network, for example to back-end system 302, a simulation request based on the representation of the quantum circuit.

For simplicity of explanation, the computer-implemented methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the computer-implemented methodologies in accordance with the disclosed subject matter. In addition, those skilled in the art will understand and appreciate that the computer-implemented methodologies could alternatively be represented as a series of interrelated states via a state diagram or events. Additionally, it should be further appreciated that the computer-implemented methodologies disclosed hereinafter and throughout this specification are capable of being stored on an article of manufacture to facilitate transporting and transferring such computer-implemented methodologies to computers. The term article of manufacture, as used herein, is intended to encompass a computer program accessible from any computer-readable device or storage media.

Figure 6:
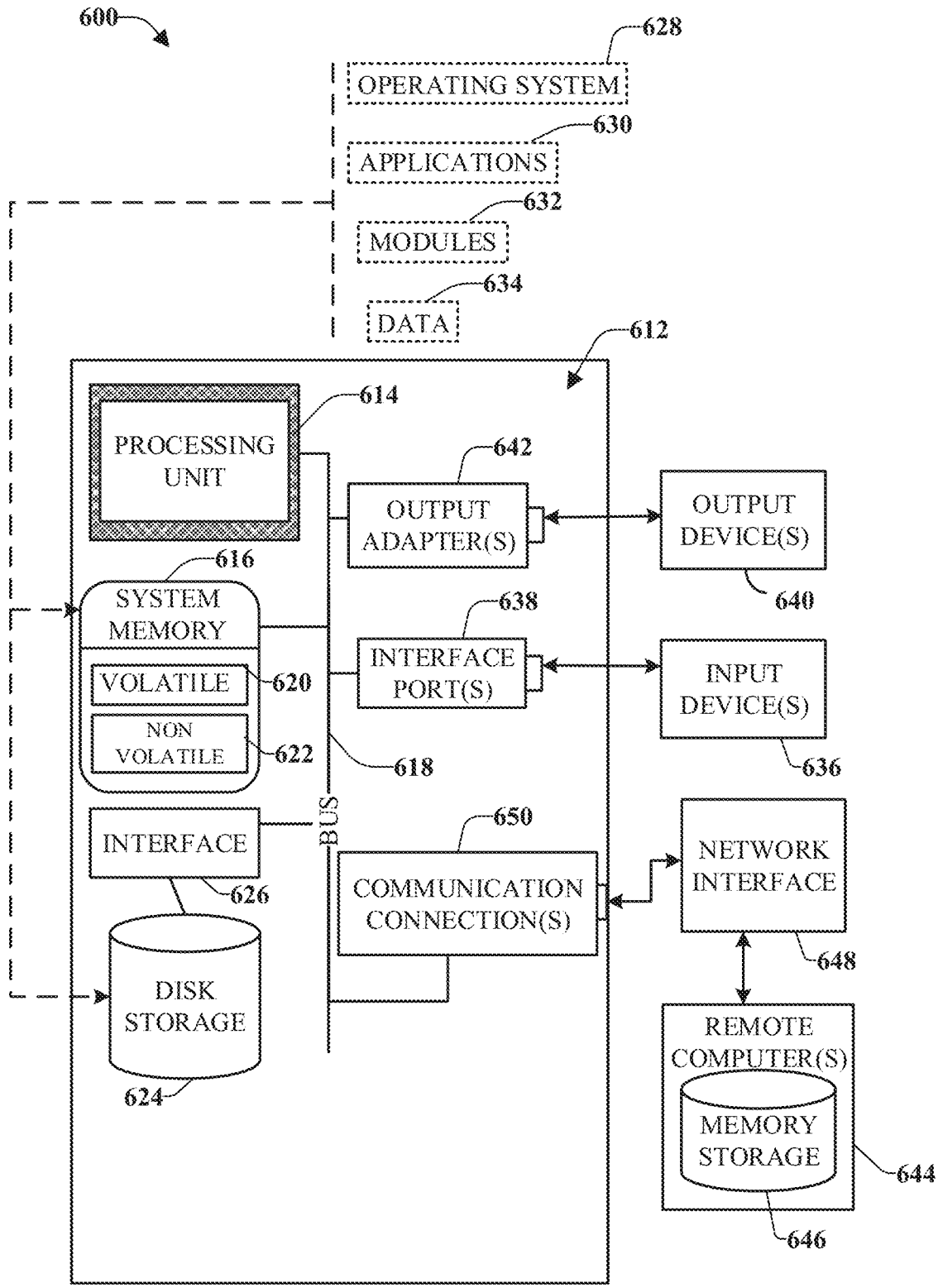
FIG. 6 illustrates a non-limiting, example block diagram of an operating environment in which one or more embodiments described herein can be facilitated.

In order to provide a context for the various aspects of the disclosed subject matter, FIG. 6 as well as the following discussion are intended to provide a general description of a suitable environment in which the various aspects of the disclosed subject matter can be implemented.

FIG. 6 illustrates a block diagram of an example, non-limiting operating environment in which one or more embodiments described herein can be facilitated. Repetitive description of like elements employed in other embodiments described herein is omitted for sake of brevity. With reference to FIG. 6, a suitable operating environment 600 for implementing various aspects of this disclosure can also include a computer 612. The computer 612 can also include a processing unit 614, a system memory 616, and a system bus 618. The system bus 618 couples system components including, but not limited to, the system memory 616 to the processing unit 614. The processing unit 614 can be any of various available processors. Dual microprocessors and other multiprocessor architectures also can be employed as the processing unit 614. The system bus 618 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), Video Electronics Standards Association (VESA)Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI). The system memory 616 can also include volatile memory 620 and nonvolatile memory 622. The basic input/output system (BIOS), containing the basic routines to transfer information between elements within the computer 612, such as during start-up, is stored in nonvolatile memory 622. By way of illustration, and not limitation, nonvolatile memory 622 can include Read Only Memory (ROM), Programmable ROM (PROM), Electrically Programmable ROM (EPROM), Electrically Erasable Programmable ROM (EEPROM), flash memory, or nonvolatile Random Access Memory (RAM) (e.g., Ferroelectric RAM (FeRAM)). Volatile memory 620 can also include RAM, which acts as external cache memory. By way of illustration and not limitation, RAM is available in many forms such as Static RAM (SRAM), Dynamic RAM (DRAM), Synchronous DRAM (SDRAM), Double Data Rate SDRAM (DDR SDRAM), Enhanced SDRAM (ESDRAM), Synchlink DRAM (SLDRAM), Direct Rambus RAM (DRRAM), direct Rambus dynamic RAM (DRDRAM), and Rambus dynamic RAM.

Computer 612 can also include removable/non-removable, volatile/non-volatile computer storage media. FIG. 6 illustrates, for example, a disk storage 624. Disk storage 624 can also include, but is not limited to, devices like a magnetic disk drive, floppy disk drive, tape drive, Jaz drive, Zip drive, LS-100 drive, flash memory card, or memory stick. The disk storage 624 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 624 to the system bus 618, a removable or non-removable interface is typically used, such as interface 626. FIG. 6 also depicts software that acts as an intermediary between users and the basic computer resources described in the suitable operating environment 600. Such software can also include, for example, an operating system 628. Operating system 628, which can be stored on disk storage 624, acts to control and allocate resources of the computer 612. System applications 630 take advantage of the management of resources by operating system 628 through program modules 632 and program data 634, e.g., stored either in system memory 616 or on disk storage 624. It is to be appreciated that this disclosure can be implemented with various operating systems or combinations of operating systems. A user enters commands or information into the computer 612 through input device(s) 636. Input devices 636 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 614 through the system bus 618 via interface port(s) 638. Interface port(s) 638 include, for example, a serial port, a parallel port, a game port, and a universal serial bus (USB). Output device(s) 640 use some of the same type of ports as input device(s) 636. Thus, for example, a USB port can be used to provide input to computer 612, and to output information from computer 612 to an output device 640. Output adapter 642 is provided to illustrate that there are some output devices 640 like monitors, speakers, and printers, among other output devices 640, which require special adapters. The output adapters 642 include, by way of illustration and not limitation, video and sound cards that provide a method of connection between the output device 640 and the system bus 618. It should be noted that other devices and/or systems of devices provide both input and output capabilities such as remote computer(s) 644.

Computer 612 can operate in a networked environment using logical connections to one or more remote computers, such as remote computer(s) 644. The remote computer(s) 644 can be a computer, a server, a router, a network PC, a workstation, a microprocessor-based appliance, a peer device or other common network node and the like, and typically can also include many or all of the elements described relative to computer 612. For purposes of brevity, only a memory storage device 646 is illustrated with remote computer(s) 644. Remote computer(s) 644 is logically connected to computer 612 through a network interface 648 and then physically connected via communication connection 650. Network interface 648 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 650 refers to the hardware/software employed to connect the network interface 648 to the system bus 618. While communication connection 650 is shown for illustrative clarity inside computer 612, it can also be external to computer 612. The hardware/software for connection to the network interface 648 can also include, for exemplary purposes only, internal and external technologies such as, modems including regular telephone grade modems, cable modems and DSL modems, ISDN adapters, and Ethernet cards.

The present invention can be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create method for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can be implemented in combination with other program modules. Generally, program modules include routines, programs, components, data structures, etc. that perform tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments where tasks are performed by remote processing devices that are linked through a communications network. However, some, if not all aspects of this disclosure can be practiced on stand-alone computers. In a distributed computing environment, program modules can be in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. Yet another example, a component can be an apparatus that provides specific functionality through electronic components without mechanical parts, wherein the electronic components can include a processor or other method to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include ROM, PROM, EPROM, EEPROM, flash memory, or nonvolatile RAM (e.g., FeRAM. Volatile memory can include RAM, which can act as external cache memory, for example. Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system, comprising:
a memory storing computer executable components; and
a processor operably coupled to the memory, wherein the computer executable components comprise:
a development component that receives data for a quantum circuit, wherein the quantum circuit comprises a quantum gate that manipulates a state of a qubit in the quantum circuit and a measure gate that measures the state of the qubit in the quantum circuit, and generates a representation of the quantum circuit based on employing the measure gate as:
a first virtual gate adapted to perform a sum operation of quantum states of the qubit being measured by the measure gate;
a second virtual gate adapted to perform a determine operation that determines a state of 0 or 1 of the qubit being measured and based on a random number; and
a third virtual gate adapted to perform a normalization operation that normalizes a state of the qubit being measured, wherein the quantum circuit comprises an additional quantum gate; and
fusing the first virtual gate to a previous quantum gate adjacent to the measure gate, and fusing the third virtual gate to the additional quantum gate, wherein the additional quantum gate is adjacent after the measure gate; and
an interface component that submits a simulation request based on the representation of the quantum circuit and receives a simulation result based on the simulation request.

2. The system of claim 1, wherein the interface component further comprises a simulator that simulates the quantum circuit based on the simulation request.

3. The system of claim 1, wherein the interface component further comprises a network interface to connect to a network and submits the simulation request to a location on the network.

4. A system, comprising:
a memory storing computer executable components; and
a processor operably coupled to the memory, wherein the computer executable components comprise:
an interface component that:
receives a simulation request comprising a representation of a quantum circuit, wherein the quantum circuit comprises a quantum gate and a measure gate employed as:
a first virtual gate for a sum operation of quantum states of the qubit being measured by the measure gate;
a second virtual gate for a determine operation that determines a quantum state of 0 or 1 of the qubit being measured and based on a random number; and
a third virtual gate for a normalization operation that normalizes the quantum state of the qubit being measured, wherein the first virtual gate is fused to a previous quantum gate adjacent to the measure gate, and the third virtual gate is fused to an additional quantum gate adjacent after the measure gate; and
a simulation component that simulates the quantum circuit based on the simulation request and transmits a result.

5. A computer-implemented method, comprising:
receiving, by a processor, quantum circuit data that represents a quantum circuit, wherein the quantum circuit comprises a quantum gate that manipulates a state of a qubit in the quantum circuit and a measure gate that measures the state of the qubit in the quantum circuit, wherein the measure gate is associated with:
a first virtual gate adapted to perform a sum operation of quantum states of the qubit being measured by the measure gate;
a second virtual gate adapted to perform a determine operation that determines a quantum state of 0 or 1 of the qubit being measured and based on a random number; and
a third virtual gate adapted to perform a normalization operation that normalizes the quantum state of the qubit being measured; and
simulating, by the processor, to generate a simulation result, the quantum circuit based on a fusion of at least the first virtual gate to a previous quantum gate adjacent to the measure gate and fusion of the third virtual gate to an additional quantum gate, wherein the additional quantum gate is adjacent after the measure gate.

6. A computer-implemented method, comprising:
receiving, by the processor, quantum circuit data for a quantum circuit, wherein the quantum circuit comprises a quantum gate that manipulates a state of a qubit in the quantum circuit and a measure gate that measures the state of the qubit in the quantum circuit;

generating, by the processor, a representation of the quantum circuit based on dividing the measure gate into a first virtual gate, a second virtual gate and a third virtual gate and fusing at least one of the first virtual gate, the second virtual gate or the third virtual gate with the quantum gate; and transmitting, by the processor, over a network, a simulation request based on the representation of the quantum circuit.

7. The computer-implemented method of claim 6, wherein generating the representation of the quantum circuit is based on dividing the measure gate into the first virtual gate for a sum operation of quantum states of the qubit being measured by the measure gate, the second virtual gate for a determine operation that determines a quantum state of 0 or 1 of the qubit being measured, and the third virtual gate for a normalization operation that normalizes the quantum state of the qubit being measured.

8. The computer-implemented method of claim 7, wherein generating the representation of the quantum circuit is based on fusing the first virtual gate with the quantum gate.

9. The computer-implemented method of claim 8, wherein generating the representation of the quantum circuit is based on fusing the third virtual gate with an additional quantum gate in the quantum circuit.

10. The computer-implemented method of claim 7, transmitting the simulation request is based on converting the representation of the quantum circuit into executable program code.

11. A computer program product that facilitates quantum computing simulation of quantum circuit comprising a quantum gate and a measure gate, the computer program product comprising a computer readable storage medium having program instructions embodied therewith, the program instructions are executable by a processor to cause the processor to:

receive, by the processor, quantum circuit data that represents the quantum circuit;

divide, by the processor, the measure gate into a first virtual gate, a second virtual gate and a third virtual gate;

fuse, by the processor, the first virtual gate with the quantum gate; and request, by the processor, a simulation of the quantum circuit based on a fusion of at least one of the first virtual gate, the second virtual gate or the third virtual gate with the quantum gate.

12. The computer program product of claim 11, wherein the program instructions are further executable by the processor to cause the processor to divide the measure gate into the first virtual gate for a sum operation of quantum states of the qubit being measured by the measure gate, the second virtual gate for a determine operation that determines a quantum state of 0 or 1 of the qubit being measured, and a third virtual gate for a normalization operation that normalizes the quantum state of the qubit being measured.

13. The computer program product of claim 11, wherein the program instructions are further executable by the processor to cause the processor to fuse the third virtual gate with an additional quantum gate in the quantum circuit.

14. The computer program product of claim 11, wherein the program instructions are further executable by the processor to cause the processor to request a simulation request based on converting a representation of the quantum circuit into program code executable by the processor.

15. The computer program product of claim 11, wherein the program instructions are further executable by the processor to cause the processor to connect to a network and request the simulation of the quantum circuit based on transmitting the request to a location on the network.

* * * * *